United States Patent
Chou et al.

(10) Patent No.: US 12,272,576 B2
(45) Date of Patent: Apr. 8, 2025

(54) APPARATUS AND METHODS FOR DETERMINING FLUID DYNAMICS OF LIQUID FILM ON WAFER SURFACE

(71) Applicant: TAIWAN SEMICONDUCTOR MANUFACTURING COMPANY, LTD., Hsinchu (TW)

(72) Inventors: Chung-Pin Chou, Hsinchu (TW); Kai-Lin Chuang, Chia-Yi (TW); Yan-Cheng Chen, Hsinchu (TW); Jui Kuo Lai, Taichung (TW); Jun Xiu Liu, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 728 days.

(21) Appl. No.: 17/351,990

(22) Filed: Jun. 18, 2021

(65) Prior Publication Data
US 2022/0406632 A1  Dec. 22, 2022

(51) Int. Cl.
*H01L 21/67* (2006.01)
*H01L 21/66* (2006.01)

(52) U.S. Cl.
CPC .. *H01L 21/67253* (2013.01); *H01L 21/67051* (2013.01); *H01L 22/10* (2013.01)

(58) Field of Classification Search
CPC ......... H01L 21/67253; H01L 21/67051; H01L 21/67259; H01L 21/67242; H01L 21/6708; H01L 21/6715; H01L 22/10; H01L 22/12; H01L 22/26
See application file for complete search history.

(56) References Cited

U.S. PATENT DOCUMENTS

| | | | |
|---|---|---|---|
| 2011/0286738 A1* | 11/2011 | Noda | H01L 21/67253 396/611 |
| 2012/0027284 A1 | 2/2012 | Hung et al. | |
| 2019/0119830 A1* | 4/2019 | Janssen | D04H 1/70 |
| 2020/0033723 A1* | 1/2020 | Yang | H01L 22/10 |
| 2020/0072696 A1* | 3/2020 | Chen | G01M 3/18 |
| 2021/0339276 A1* | 11/2021 | Vukovic | G01B 11/0625 |
| 2022/0269177 A1* | 8/2022 | Carcasi | G03F 7/162 |

FOREIGN PATENT DOCUMENTS

| | | |
|---|---|---|
| TW | 202003118 A | 1/2020 |
| WO | 2021/076320 A1 | 4/2021 |

* cited by examiner

*Primary Examiner* — Dale E Page
*Assistant Examiner* — Lawrence C Tynes, Jr.
(74) *Attorney, Agent, or Firm* — STUDEBAKER BRACKETT PLLC

(57) ABSTRACT

An apparatus for inspecting a semiconductor substrate includes a rotatable base configured to support a substrate, and a nozzle arm includes a nozzle and a light monitoring device. The light monitoring device includes a laser transmitter and an array of light sensors arranged in the nozzle arm and facing the substrate. The light monitoring device is configured to transmit a laser pulse towards the substrate, wherein the laser pulse impinges on the substrate, receive a reflected laser pulse from the substrate, calculate whether one or more light sensors received the laser pulse, and calculate a distance between the light monitoring device and the substrate using the turnaround time for determining a process quality on the substrate.

20 Claims, 12 Drawing Sheets

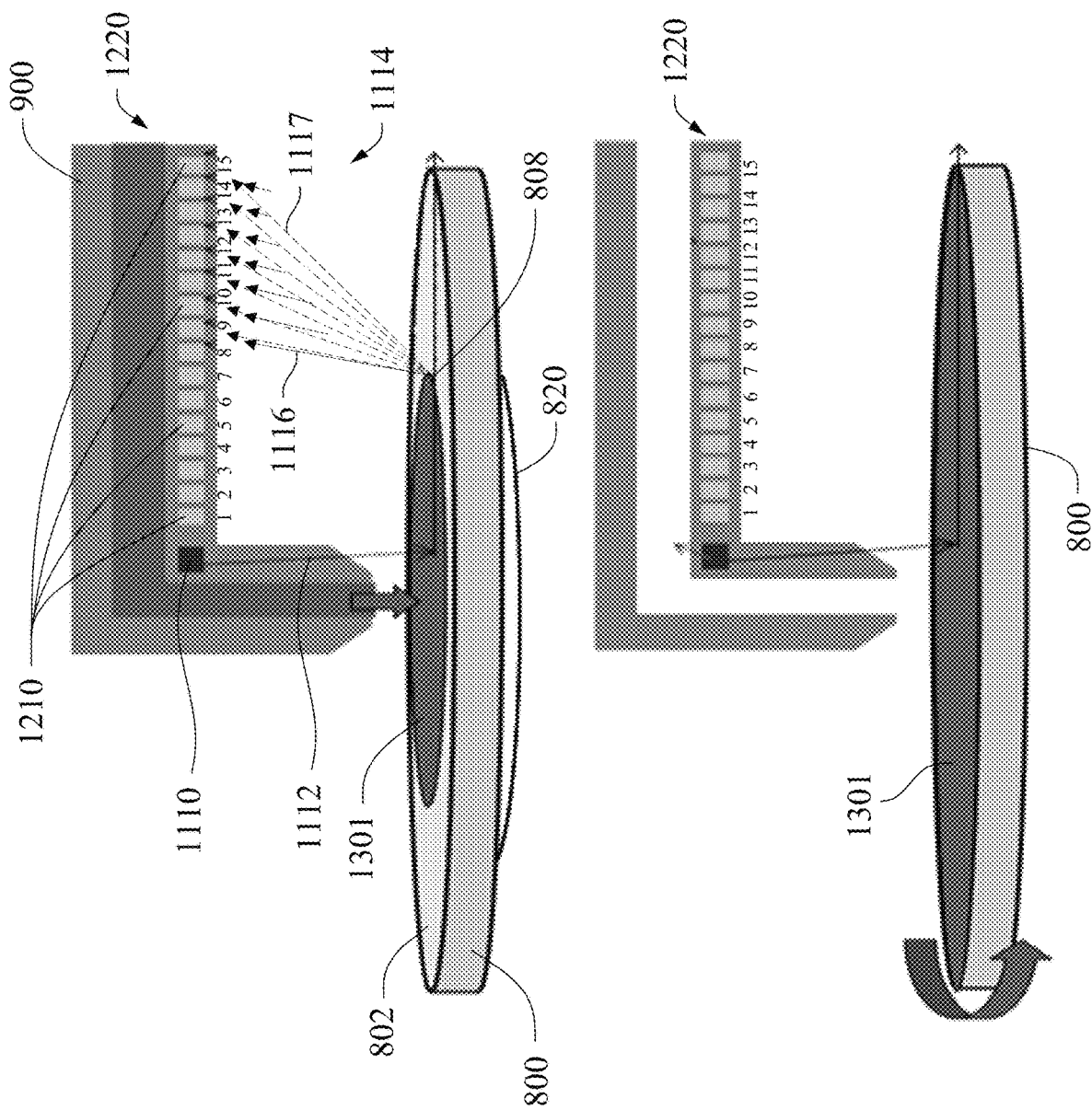

APPARATUS AND METHODS FOR DETERMINING FLUID DYNAMICS OF LIQUID FILM ON WAFER SURFACE

BACKGROUND

In liquid application apparatuses used in a semiconductor fabrication process, real-time monitoring and/or observing an applied liquid on a wafer are one of the key factors to control uniformity of a liquid application process. As the semiconductor industry has progressed into nanometer process in pursuit of higher device density, higher performance, and lower costs, there is a need to more precisely monitor the status of an applied liquid on a wafer and/or a nozzle in real-time.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B, 4C and 4D are schematic views of an apparatus for monitoring and inspecting an applied liquid on a wafer according to embodiments of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of"

In a semiconductor manufacturing operation, various wet processes using liquids, such as water or various chemicals (acid, base, solvent, etc.) are used. For example, a lithography process uses a photo resist coating operation and a resist developing operation. Other wet processes include a wet cleaning operation and a wet etching operation. In these wet operations, a liquid is applied on a wafer from a nozzle while a wafer is rotating. Some of the key factors to control applying a liquid from the nozzle include monitoring droplet leakage from the nozzle and monitoring liquid behavior on a wafer. Although it is possible to visually monitor the liquid behavior by using an imaging device, such as charge-coupled devices (CCD) or high-speed cameras, a more reliable and precise method for monitoring the liquid behavior is desired. In the present disclosure, a laser source and a detector array arranged on the nozzle is employed to monitor the status of a nozzle in real-time and liquid motion/dynamics on the wafer with the working principle of total internal reflection.

Figure 1:
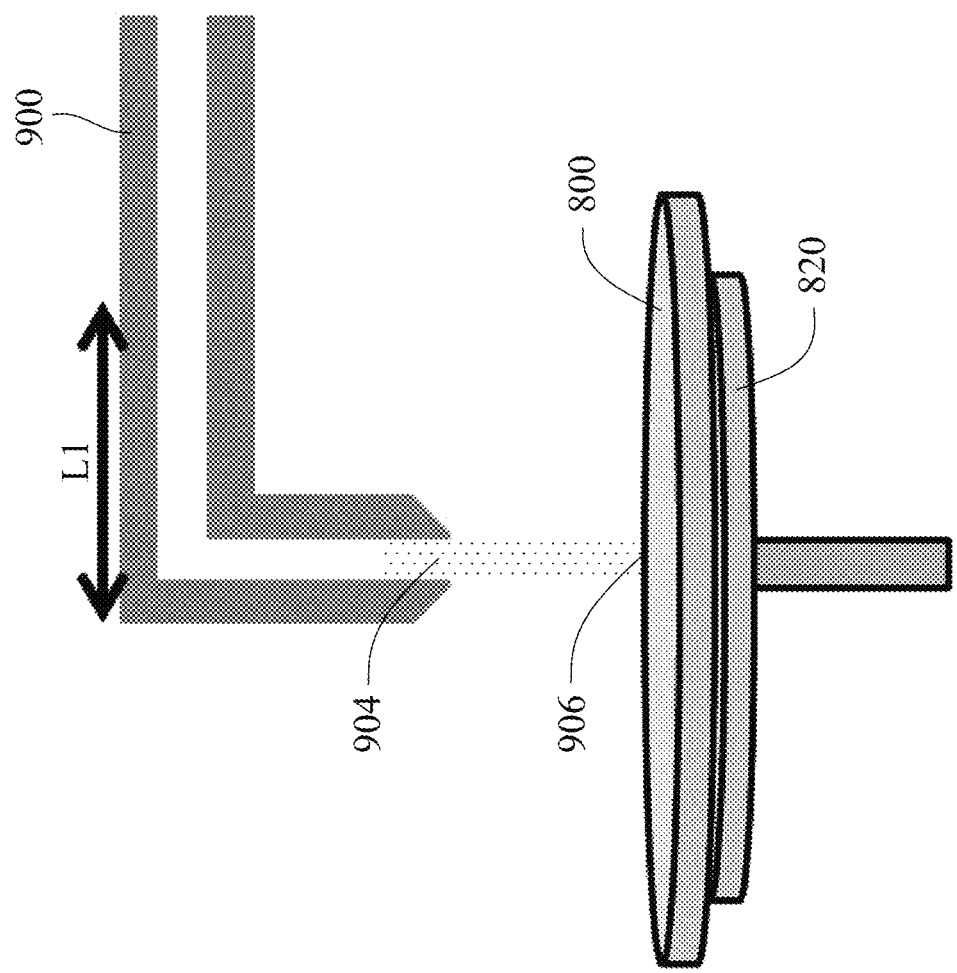
FIG. 1 is a schematic view of an apparatus for chemical processes.

FIG. 1 illustrates a cross-sectional schematic view of a wet process apparatus including a nozzle arm 900 and a rotatable base 820. The rotatable base 820 is supported by a supporting mechanism and provides a support upon which the substrate 800 rests. In some embodiments, the periphery of substrate 800 rests on a supporting element attached to the rotatable base 820. In some embodiments, the nozzle arm 900 is configured to change positions by moving a center of the nozzle 904 in a direction of "L1" to apply a liquid on a drop site 906 on the substrate 800.

Figure 2:
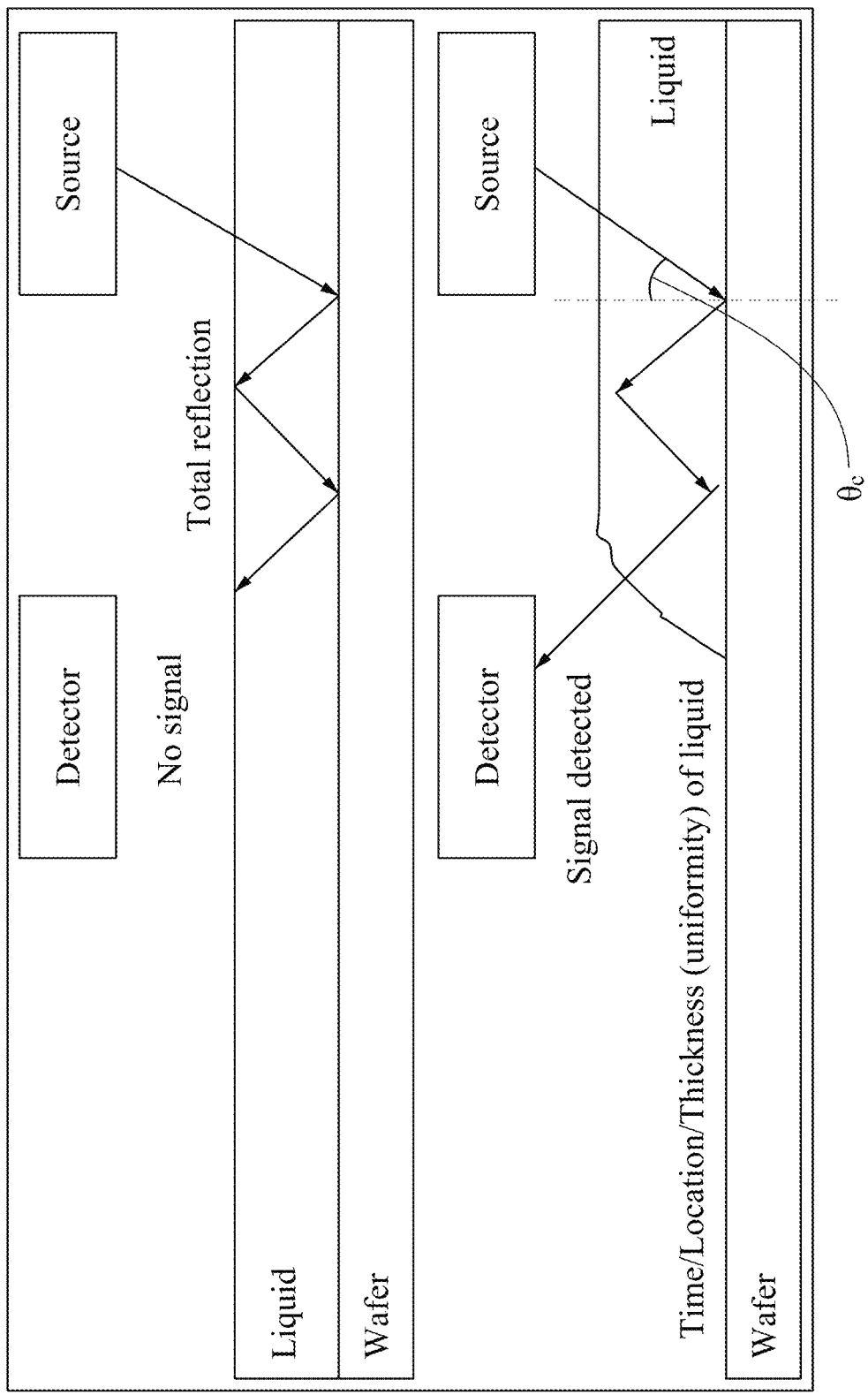
FIG. 2 schematically illustrates a light beam undergoing total internal reflection.

FIG. 2 schematically illustrates a light beam undergoing total internal reflection. The light beam emitted from a source and propagates through a transparent medium, "Liquid", and undergoes a total internal reflection when the beam encounters an interface with another medium having a lower refractive index (RI) at an angle of incidence greater than the "critical angle". The critical angle $\theta_c$ is given by:

$$\theta_c = \sin^{-1}(n_2/n_1) \quad \text{Equation (1)},$$

where $n_2$ is the RI of the other medium (e.g., air) and $n_1$ is the RI of the medium in which the beam is propagating (e.g., "Liquid").

As shown in FIG. 2, a light beam propagating in a liquid, e.g., water (RI=1.33) approaching an interface with air (RI=1) will undergo total internal reflection back into water if the angle of incidence at the interface is greater than $\theta_c = \sin^{-1}(1/1.33) \approx 48.6°$. When the liquid fully covers the wafer, the internally reflected light does not exit from the surface of the liquid and may exit from the edge portion of the wafer. When, however, the liquid partially covers the wafer, the internally reflected light exits from an end portion of the liquid. The applied liquid on the wafer spreads as the time passes, and the location of the exit light also changes as the time passes. By detecting such an exit light by a detector, it is possible to monitor or observe the status or behavior of the liquid on the wafer.

Figure 3:
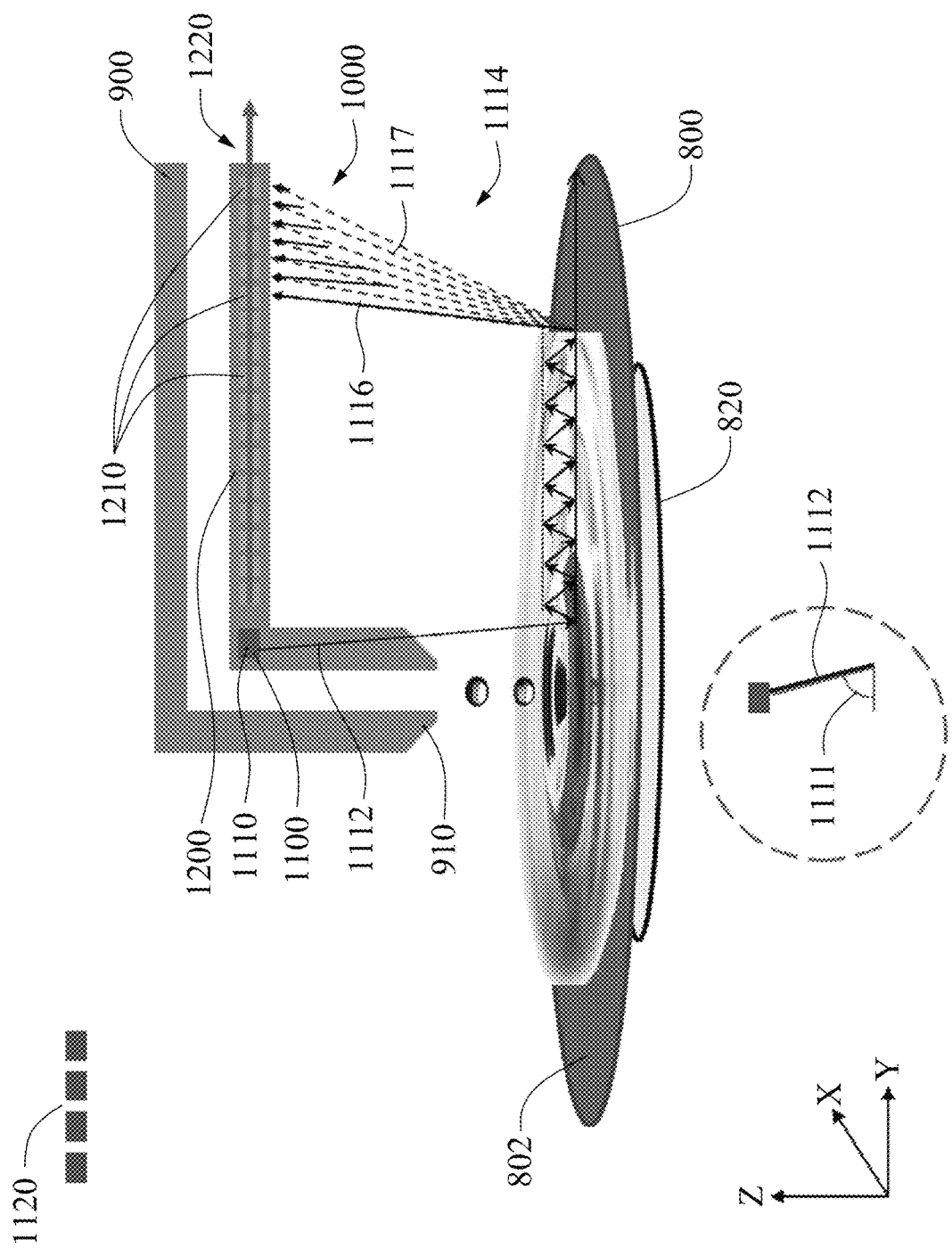
FIG. 3 is a schematic view of an apparatus for monitoring and inspecting an applied liquid on a wafer in accordance with some embodiments of the present disclosure.

FIG. 3 is a schematic view of the nozzle arm 900 including a nozzle 910 and a light monitoring system 1000 in accordance with some embodiments of the present disclosure. The light monitoring system 1000 includes a light source 1100 and a light detector 1200. According to some embodiments of the disclosure, the light monitoring system 1000 includes optically sensing and measuring devices that use, for example, a laser, to provide a quantitative and on-line recording of the process quality. In some embodiments, the light source 1100 includes a laser beam transmitter 1110, such as a semiconductor laser device. In some embodiments, a plurality of laser beam transmitters 1120 may be used. In some embodiments, the light detector includes an array 1220 of light sensors 1210, such as a semiconductor photo detector. In some embodiments, the light sensors 1210 are linearly arranged (line sensors), and in other embodiments, the light sensors are two dimensionally arranged. In particular, when the light sources 1100 include multiple laser sources arranged in an X direction, multiple detectors are arranged in an X-Y matrix.

The laser beam transmitter 1110 is configured to emit a laser beam 1112 towards the substrate 800. In some embodiments, the laser beam transmitter 1110 is configured to emit a laser beam 1112 in a continuous wave form or in a form of pulses towards the substrate 800. The laser beam transmitter 1110 is arranged in the nozzle arm, for example, on a lower surface of the nozzle arm facing the substrate 800 on the rotatable base 820. In some embodiments, the laser beam transmitter 1110 is configured to adjust an angle 1111 of incident laser beam 1112 of the laser transmitter towards the substrate to select one or more light sensors that receive the reflected laser beam. In some embodiments, the light source 1100 includes the plurality of laser beam transmitters 1120 and emits the laser pulses sequentially or in a desired order. In other embodiments, the plurality of laser beam transmitters emit the laser pulses simultaneously or near simultaneously. The arrangement of the plurality of laser beam transmitters 1120 and the laser beam transmitter 1110 are not limited to the arrangement illustrated in FIG. 3. The plurality of laser beam transmitters 1120 is positioned in any desired configuration on the lower surface. In some embodiments, the light source 1100 is disposed at a location other than the nozzle or nozzle arm, for example, an inner wall of a chamber or a cup surrounding the rotational base 820.

The array 1220 of light sensors 1210 is configured to receive a reflected laser beam 1114 that includes a reflected light 1116 from the substrate 800 and a scattered light 1117, and generate signals. The array 1220 is arranged in the nozzle arm, for example, on a lower surface of the nozzle arm facing the substrate 800 on the rotatable base 820. The light sensors 1210 are spaced apart within the array arranged in the nozzle arm 900. In some embodiments, the light sensors 1210 are disposed at a location other than the nozzle or nozzle arm, for example, an inner wall of a chamber or a cup surrounding the rotational base 820 or an independent support member.

The light monitoring system 1000 in accordance with some embodiments of the present disclosure determines a process quality on the substrate by analyzing a signal of the light reflected from the substrate received by an array of light sensors. In some embodiments, each of the light sensors 1210 generates and outputs signals ("0" for light not received or "1" for light received) or signals according to the intensities of the received reflected light. Based on the signals identified by the light sensors 1210, a process quality such as, an existence of a process chemical liquid, a diameter of the process chemical liquid spread, or a level of dryness of the process chemical liquid is identified. In some embodiments, the array 1220 of light sensors 1210 further includes a bandpass filter that, in operation, passes the light in a pre-determined wavelength range, for example, wavelengths longer than or equal to 650 nm and shorter than or equal to 950 nm. In some embodiments, an arithmetic circuit that is connected to the array 1220 of light sensors 1210 and that, in operation, generates and outputs information indicating whether the process quality such as, for example, existence of a process chemical liquid, a diameter of the process chemical liquid, or a level of dryness of the process chemical liquid, is located at a position corresponding to each pixel included in the light detected denoted by the light signal.

Embodiment 1: Chemical Control

In some embodiments, as shown in FIGS. 4A, 4B, 4C and 4D, the light source includes a laser beam transmitter 1110 and the light detector includes the array 1220 of light sensors 1210.

In some embodiments, the light monitoring system 1000 is configured to monitor and control a chemical process. As shown in FIG. 4A, the laser beam transmitter 1110 emits a laser beam 1112 towards the top surface 802 of the substrate 800. The substrate 800 is placed on the rotatable base 820, while the rotatable base is not moving. Then, the nozzle arm 900 dispenses a first chemical liquid 1301 onto the wafer and the wafer is rotated. In other embodiments, the first chemical liquid 1301 is dispensed from the nozzle while the wafer is rotating. When the first liquid partially covers the wafer, one or more light sensors, for example sensors 1 through 8, of the array 1220 do not receive the reflected laser beam 1114 from the substrate 800 and the sensor 9 receives the reflected laser beam. The applied first chemical liquid 1301 on the wafer spreads as time passes, and the location of the internally reflected light exit changes as time passes. For example, when the first chemical liquid 1301 extends to a radial point 808 of the wafer, as shown in FIG. 2, the internally reflected light exits from an end portion of the first chemical liquid 1301 at the radial point 808 of the wafer, and one or more light sensors, for example, sensor 9, of the array 1220 receives the reflected laser beam 1114 (first reflected light 1116) from the substrate 800. As shown in FIG. 3, sensors 10 through 15 may receive the scattered light 1117 and generate signals depending on the reflected light intensity.

By centrifugal force due to the rotation of the substrate 800, the first chemical liquid 1301 spreads over the top surface 802 of the substrate 800. When the top surface of the substrate is completely covered with the first chemical liquid 1301, none of the light sensors, sensor 1 through 15, of the array 1220 receive the reflected laser beam from the substrate 800. Referring back to FIG. 2, the internally reflected light exits from an end portion of the first chemical liquid 1301, which is outside of the wafer, and none of the light sensors receives the reflected laser beam 1114 (first reflected light) or the second scattered light from the substrate 800.

Figure 4C:
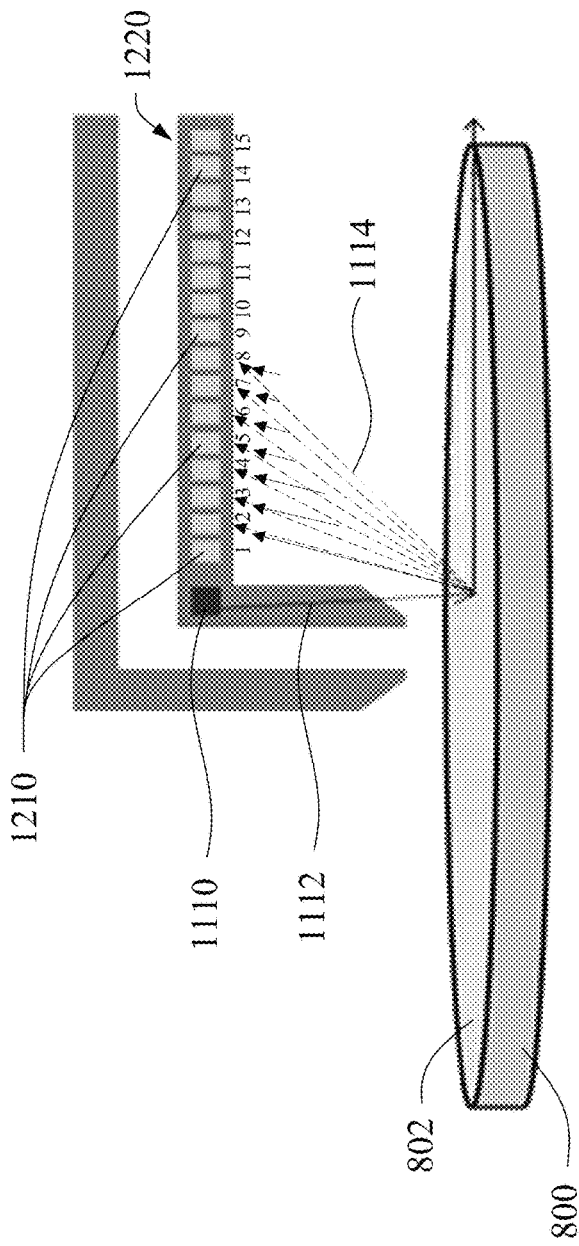

Then, as shown in FIG. 4C, after a spin-dry operation is completed to remove the first chemical liquid from the upper surface of the substrate 800, the light sensors, sensor 1 through 8, of the array start receiving the reflected laser beam 1114 from the substrate. The light sensors, sensor 9 through 15 do not detect or receive very little of the reflected laser beam 1114 from the substrate. As there is no applied chemical liquid on the wafer, there is no internally reflected light. The laser beam 1112 emitted from the laser beam transmitter 1110 reflects from the substrate 800 and one or more light sensors, for example, sensor 2, of the array 1220 receives the reflected laser beam 1114 (first reflected light) from the substrate 800. The sensors 3 through 8 may receive the second scattered light, as shown in FIG. 3, and generate signals depending on the reflected light intensity. In some embodiments, the laser beam transmitter 1110 adjusts an angle of the incident laser beam 1112 of the laser transmitter towards the substrate, so that all light sensors, sensors 1 through 15 receive the reflected laser beam 1114 from the substrate.

Figure 4D:
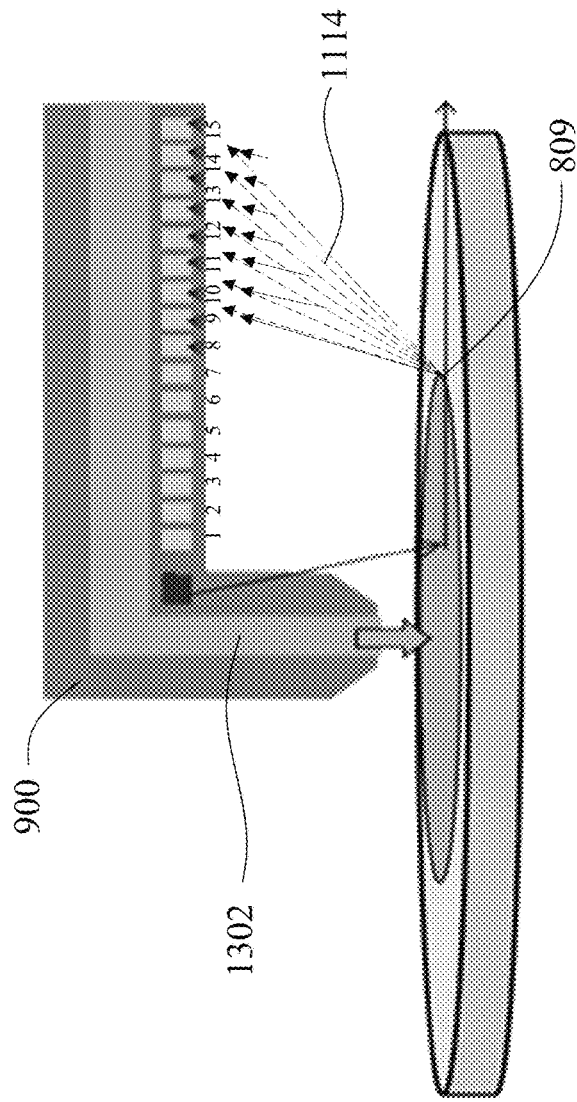

When the light sensors, such as sensor 2 and other sensors, identify that there is no first chemical liquid on the upper surface of the substrate 800, as shown in FIG. 4D, a second chemical liquid 1302 is dispensed from the nozzle arm 900. Similar to FIGS. 4A and 4B, the light sensors sequentially receive the reflected light until the second chemical liquid fully covers the wafer. The applied second chemical liquid 1302 on the wafer spreads as time passes, and the location of the internally reflected light exit changes as time passes. For example, when the second chemical liquid 1302 reaches a second radial point 809 of the wafer, as shown in FIG. 2, the internally reflected light exits from an end portion of the second chemical liquid 1302 at the second radial point 809 of the wafer, and one or more light sensors, for example, sensor 9, of the array 1220 receives the reflected laser beam 1114 (first reflected light) from the substrate. As shown in FIG. 3, sensors 10 through 15 may receive the second scattered light and generate signals depending on the reflected light intensity. In some embodiments, depending on the refractive index of the second chemical liquid, an incident angle of the light source is adjusted to cause total internal reflection.

Embodiment 2: Droplet Leak

Figure 5A:
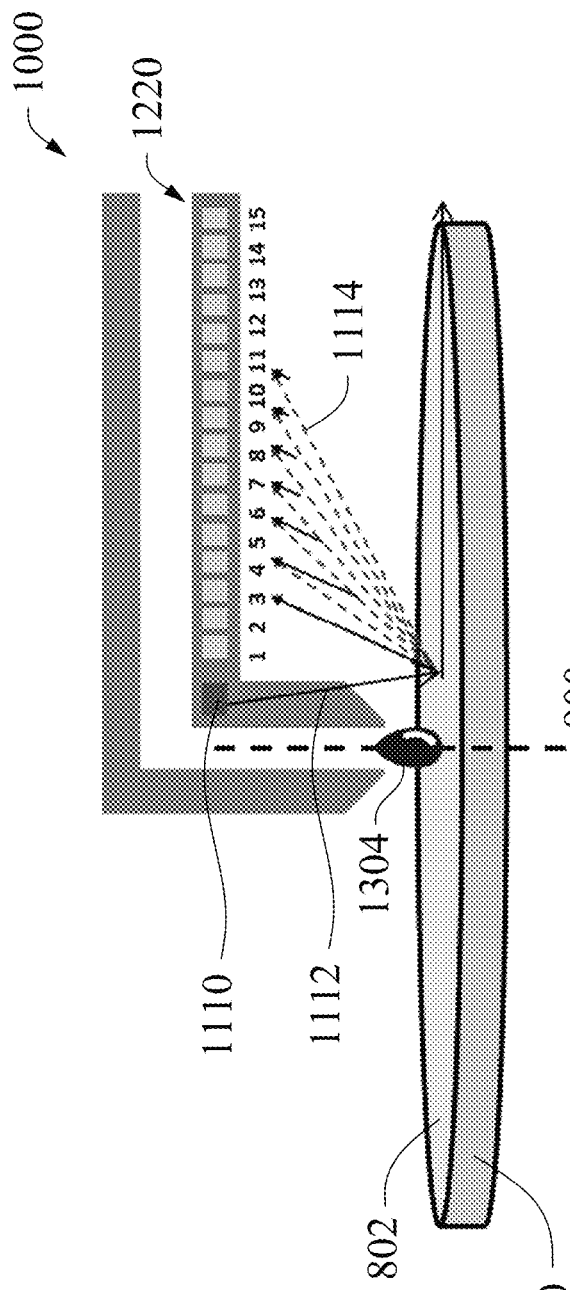
FIGS. 5A and 5B are schematic views of an apparatus for monitoring and inspecting an applied liquid on a wafer according to embodiments of the disclosure.
Figure 5B:
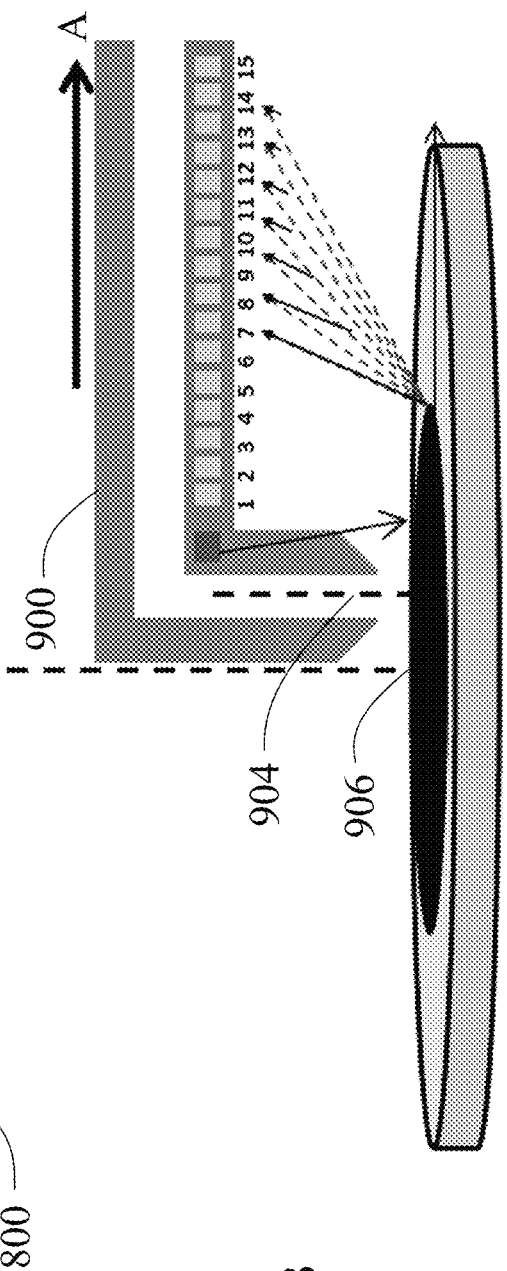

In some embodiments, as shown in FIGS. 5A-5B, the light monitoring system 1000 is configured to monitor a droplet as a leak of the liquid. As shown in FIG. 5A, the laser beam transmitter 1110 emits the laser beam 1112 towards the top surface 802 of the substrate 800. The substrate 800 is placed on the rotatable base. The rotatable base may be rotating or not moving. All of the light sensors, sensor 1 through 15, of the array 1220 receive the reflected laser beam 1114 from the substrate 800. In some embodiments, when the application of the liquid ends, or during or ending of the spin-drying operation, the nozzle arm moves outside the wafer (arrow A shown in FIG. 5B). In an event a leaking photoresist or developer droplet 1304 falls from the nozzle as shown in FIG. 5A, the photoresist droplet 1304 spreads radially outwardly and over the top surface 802 of the substrate 800. When there are no liquid over the wafer, sensors 3-11, for example, receive the reflected and scattered light.

As shown in FIG. 5B, when the light monitoring system 1000 is configured to retract the nozzle arm 900 in a direction "A" moving the center of the nozzle 904 away from a drop site 906, some of the sensors, for example, different from the sensors 3-11, receive the reflected light caused by the leaked droplet. According to the liquid spread amount, the light sensors, sensor 1 through 5, of the array do not receive the reflected laser pulses from the substrate, and the light sensors, sensors 6 through 13, of the array receive the reflected laser pulses from the substrate. As a result, the light monitoring system 1000 confirms that there was a leak of the liquid from the nozzle. In some embodiments, the light monitoring system 1000 further identify a source of the leak when it is determined that there was the leak of the liquid from the nozzle.

Embodiment 3: Liquid Residue

Figures 6A, 6B:
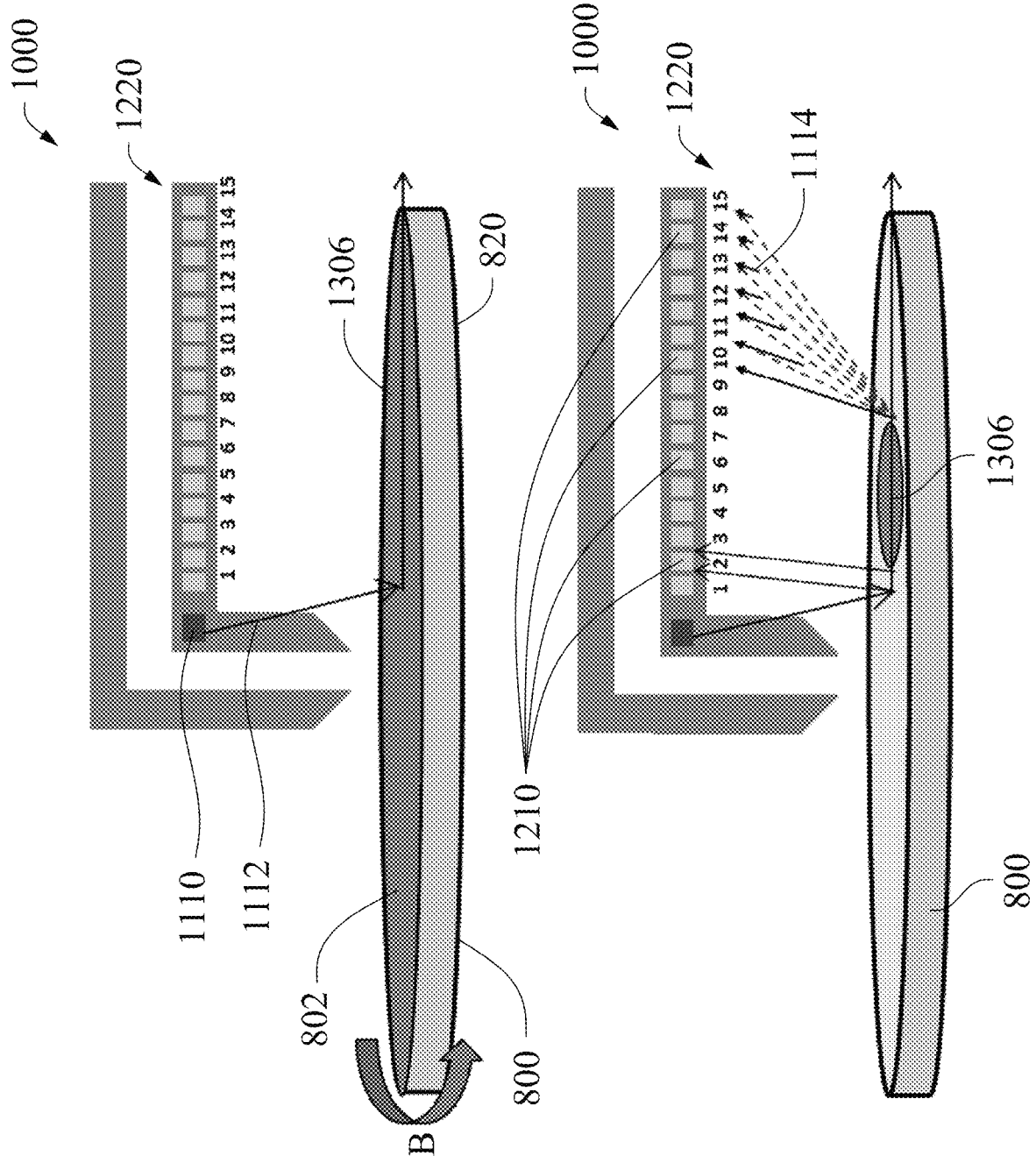
FIGS. 6A and 6B are schematic views of an apparatus for monitoring and inspecting an applied liquid on a wafer according to embodiments of the disclosure.

In some embodiments, as shown in FIGS. 6A-6B, the light monitoring system 1000 is configured to monitor a residue of the liquid, for example, a photoresist. As shown in FIG. 6A, the laser beam transmitter 1110 emits a laser beam 1112 towards the top surface 802 of the substrate 800. The substrate 800 is placed on the rotatable base 820, and the rotatable base rotates in a direction "B" for a spin-dry operation. None of the light sensors, sensors 1 through 15, of the array 1220 receive the reflected laser beam from the substrate 800 due to an applied chemical liquid 1306. By centrifugal force due to the rotation of the substrate 800, the applied chemical liquid 1306 is covered on the top surface 802 of the substrate 800.

When, as shown in FIG. 6B, a liquid residue remains after the spin-dry operation is completed, while the light sensors, sensors 3 through 7, of the array do not receive the reflected laser beam 1114 from the substrate due to the residue of the applied chemical liquid 1306, the light sensors, sensors 1, 2, and 8 through 13, of the array receive the reflected laser beam 1114. When there is no residue, similar to FIG. 4C, sensors 1-8 receive the reflected and scattered light. As a result, the light monitoring system 1000 can detect whether there is a residue of the liquid, such as a photoresist 1306, on the substrate 800.

Embodiment 4: Cleaning Process Optimization

Figures 7A, 7B:
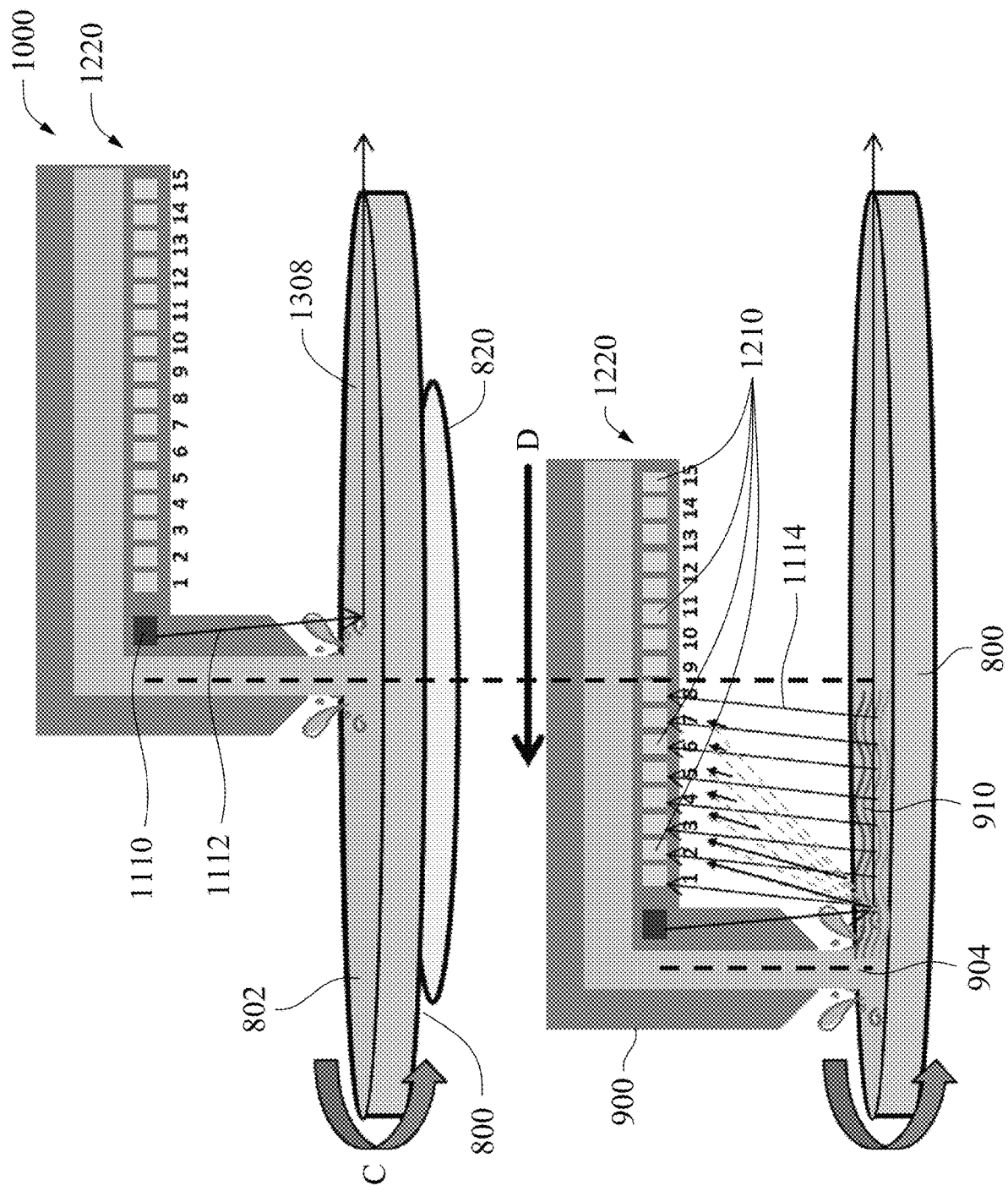
FIGS. 7A and 7B are schematic views of an apparatus for monitoring and inspecting an applied liquid on a wafer according to embodiments of the disclosure.

In some embodiments, as shown in FIGS. 7A-7B, the light monitoring system 1000 is configured to optimize a cleaning process of the wet processing. As shown in FIG. 7A, the laser beam transmitter 1110 emits a laser beam 1112 towards the top surface 802 of the substrate 800. The substrate 800 is placed on the rotatable base 820, and the rotatable base starts rotating in a direction "C" for the cleaning operation. None of the light sensors, sensors 1 through 15, of the array 1220 receive the reflected laser pulses from the substrate 800 due to the total internal reflection within the spread cleaning liquid 1308. By centrifugal force due to the rotation of the substrate 800, the cleaning liquid 1308 covers the top surface 802 of the substrate 800.

Then, as shown in FIG. 7B, the light monitoring system 1000 is configured to maintain the rotation of the substrate 800 and move the nozzle arm 900 in a direction "D" so that the center of the nozzle 904 moves away from a center of the substrate 800. While the light sensors 9 through 15 of the array do not receive the reflected laser beam 1114 from the substrate, the light sensors 1 through 8 of the array receive the reflected laser beam 1114 from the substrate due to a fluid ripple 910 caused by the movement of the substrate 800. The light monitoring system 1000 is further configured to record and use the information of the reflected laser beam received by the light sensors 1210 of the array 1220. As a result, the light monitoring system 1000 determines a best path to clean the substrate 800.

The light monitoring system 1000 emits laser pulses 1112 towards the substrate 800. A single pulse sequence will be described, though it is understood a plurality of pulses of laser light is applied in some embodiments. The light monitoring system 1000 emits a single laser pulse 1112, receives the reflected laser pulse 1114 from the substrate 800, and calculates the turnaround time (TAT) and distance (discussed below) before emitting the next laser pulse. In an example, this can be achieved by increasing the repetition rate between two successive pulses or by stopping pulse generation by the light monitoring system 1000 after a single laser pulse has been emitted. However, in other embodiments, the light monitoring system 1000 can emit a series of pulses and perform measurements based on the series of pulses reflected from the substrate 800.

The laser pulse 1112 strikes (impinges upon) the top surface 802 of substrate 800 and is reflected back (reflected pulse 1114) to the light detector 1200 of the light monitoring system 1000. The light monitoring system 1000 calculates the time it takes for the reflected laser pulse 1114 to be received. This time, also referred to as turnaround time (TAT), is calculated by measuring the duration from the time the laser pulse 1112 is emitted by the light monitoring system 1000 and the time the reflected laser pulse 1114 is received by the light monitoring system 1000. In other embodiments, the light monitoring system 1000 transmits a first signal (command) to an external controller (e.g., computing system 2000, FIGS. 10A and 10B) when the laser pulse 1112 has been emitted and a second signal (command) when the reflected laser pulse 1114 has been received. When the first signal is received, the controller starts a timer and when the second signal is received, the controller stops the timer. The turnaround time is thereby obtained using the timer. It should be noted that the reflected laser pulse 1114 and the laser pulse 1112 are substantially the same laser pulse. The different labels are provided for the sake of explanation to differentiate between an emitted (transmitted) laser pulse and a reflected laser pulse.

In some embodiments, based on the respectively calculated turnaround times, the light monitoring system 1000 calculates a corresponding distance between the light monitoring system 1000 and the substrate 800. The logic (software or hardware) for calculating the distance from the turnaround time is included in the light monitoring system 1000, and the light monitoring system 1000 provides the calculated distance to the controller for indicating (e.g., displaying on a display 2004, FIG. 10A) the same to the operator. In other embodiments, the logic (software or circuit) for calculating the distance from the turnaround time is included in the controller 1410. In this case, the light monitoring system 1000 transmits the turnaround time to the controller 1410 and the controller 1410 provides the operator with the calculated distance.

Depending on the distances measured by the light monitoring system 1000, a direction of the process quality can be determined. In other words, it can be determined, whether the rotatable base 820 is rotating the substrate 800 at a constant speed, thereby maintaining a uniformity of the processing film thickness. Alternatively, whether the rotatable base 820 is not rotating the substrate 800 at a constant speed can be determined, thereby indicating the processing film thickness may not be uniform.

In some embodiments, the light monitoring system 1000 is also programmed (via software or hardware circuitry) or otherwise configured to implement a timeout condition in which light monitoring system 1000 waits for a certain amount of time to receive the reflected laser pulse 1114. If the reflected laser pulse 1114 is not received with the amount of time (i.e., the time limit is exceeded), a timeout is declared and the operator is notified (e.g., a notification on a display 2004 in FIG. 10A). The timeout may indicate that the substrate 800 is severely inclined such that the reflected laser pulse 1114 does not bounce back to the light monitoring system 1000 from which it was emitted. This may be indicative that the robotic nozzle arm has malfunctioned and is incapable of handling the substrate as intended. The operator can then perform the necessary remedial actions on the robotic nozzle arm. Alternatively, it may be indicative of other apparatus malfunctions or other errors, and the necessary remedial actions are performed.

Figure 8:
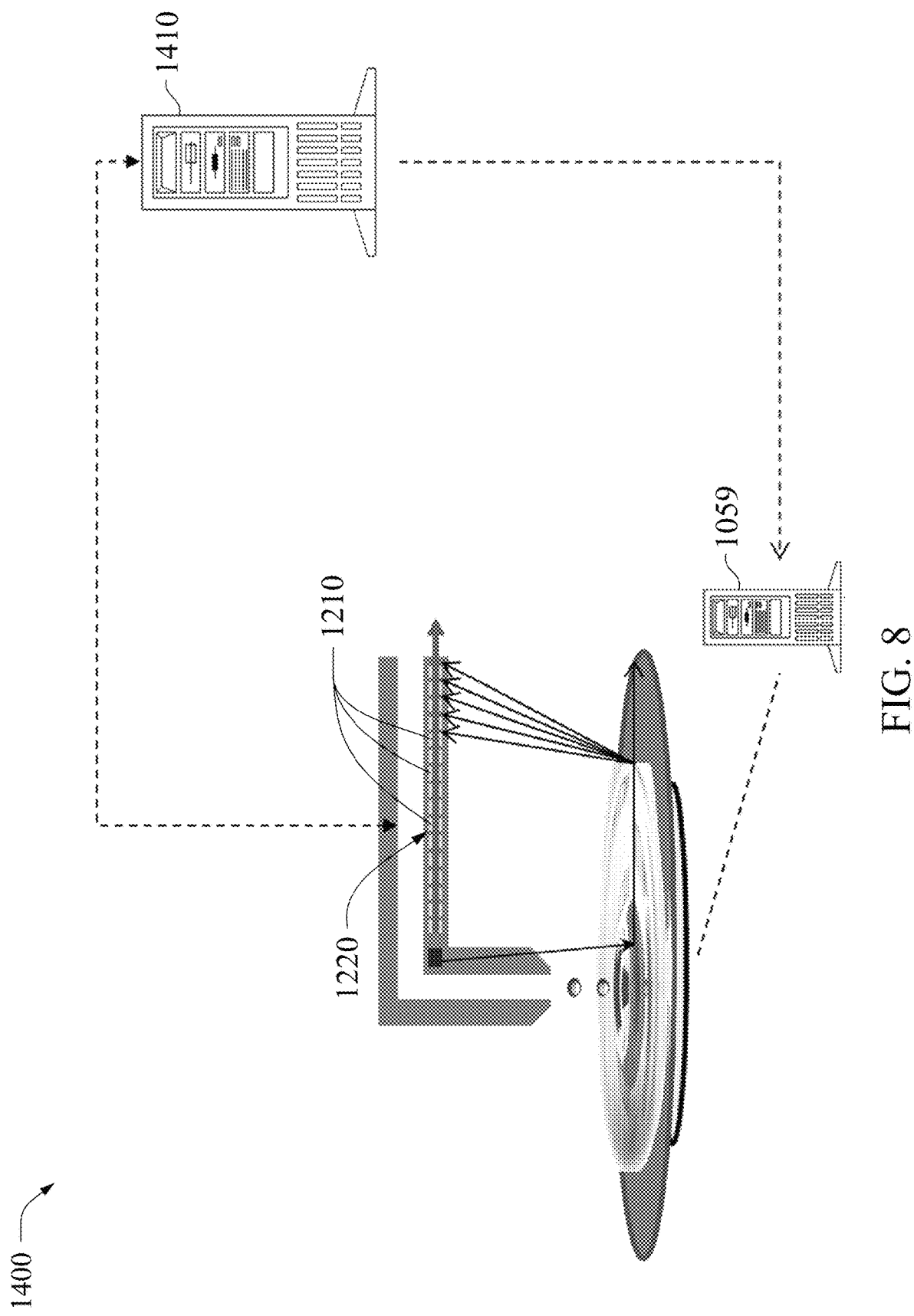
FIG. 8 shows a schematic of a feedback control system for controlling process according to some embodiments of the present disclosure.

As shown in FIG. 8, in some embodiments, a feedback control system 1400 is provided for controlling the chemical process quality based on a change in process quality (for example, uniformity of a liquid application process or uniformity of the processing film thickness) generated by the light sensors 1210 of the array 1220. In some embodiments, an analysis for the process quality is performed to monitor the change in the process quality. In some embodiments, the change in the process quality is determined by the controller 1410 based on the analysis of the process quality by the light sensors 1210 of the array 1220. In some embodiments, when changes in the process quality are detected by the light sensors 1210 of the array 1220, the controller 1410 of the feedback control system 1400 performs a process based on a value of the process quality and/or a changing the process quality measured by the light sensors 1210 of the array 1220.

In some embodiments, a fluidic element controller 1059 is located adjacent to the nozzle arm 900 and the rotatable base 820. The fluidic element controller 1059 controls a plurality of fluidic elements such as a control valve, a pump, and a compressor. The signal from the fluidic element controller 1059 is used as a feedback for adjusting the subsequent process in some embodiments. In some embodiments, the feedback may be connected with an actuator to control one of the fluidic elements.

The feedback control system provided in some embodiments further send a notification based on a subsequent quality analysis information indicating the quality analysis is within the acceptable quality analysis range. In some embodiments, the notification includes a spectrum difference between the process chemical fluid supply and the dispensing. In some embodiments, based on the generating the notification, the feedback further sends the notification to a first external device associated with a fluidic element controller 1059 and a second external device associated with the next process tool.

Figure 9:
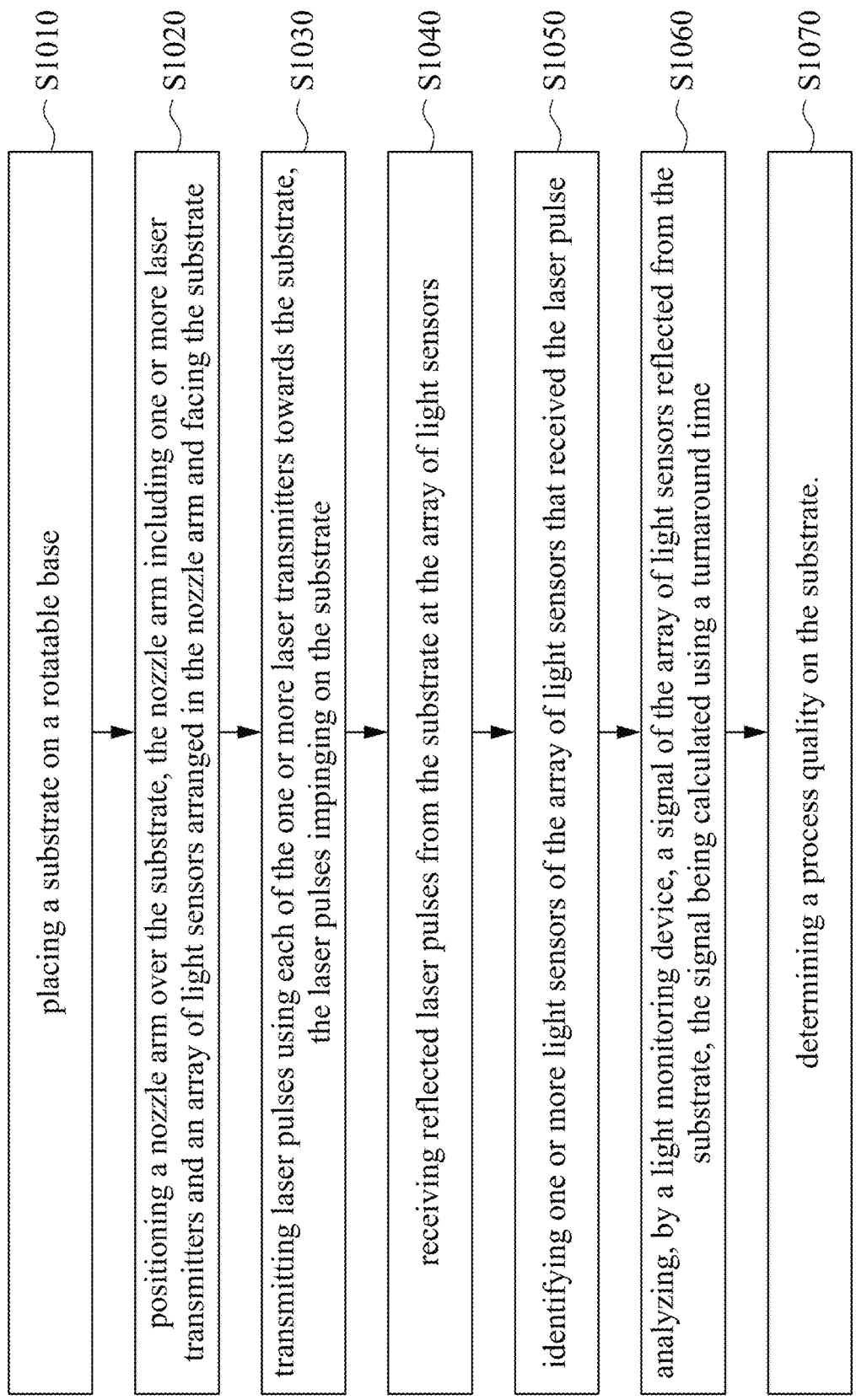
FIG. 9 shows a flow chart of a method of monitoring and inspecting an applied liquid on a wafer according to an embodiment of the disclosure.

FIG. 9 shows a flow chart of a method of inspecting surface defect and process quality according to an embodiment of the disclosure. The method includes, at S1010, placing a substrate on a rotatable base. At S1020, a nozzle arm is positioned over the substrate. The nozzle arm includes one or more laser transmitters and an array of light sensors arranged in the nozzle arm and facing the substrate. Then, at S1030, laser pulses using each of the one or more laser transmitters are transmitted towards the substrate, in which the laser pulses are impinging on the substrate. At S1040, reflected laser pulses are received from the substrate at the array of light sensors. Consequently, at S1050, one or more light sensors of the array of light sensors that received the laser pulse are identified. At S1060, a light monitoring device analyzes a signal of the array of light sensors reflected from the substrate, in which the signal is being calculated using a turnaround time. Finally, at S1070, a process quality on the substrate is determined.

Figure 10A:
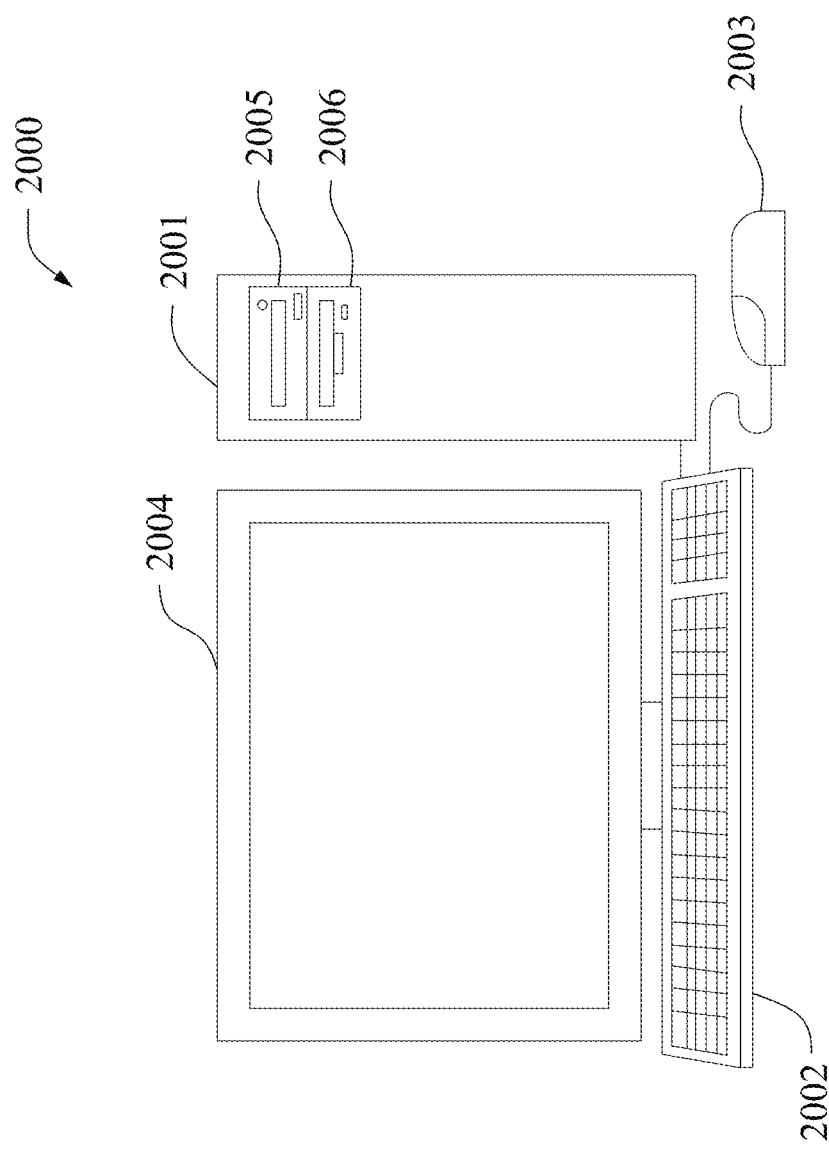
FIGS. 10A and 10B illustrate a controller in accordance with some embodiments of the disclosure.
Figure 10B:
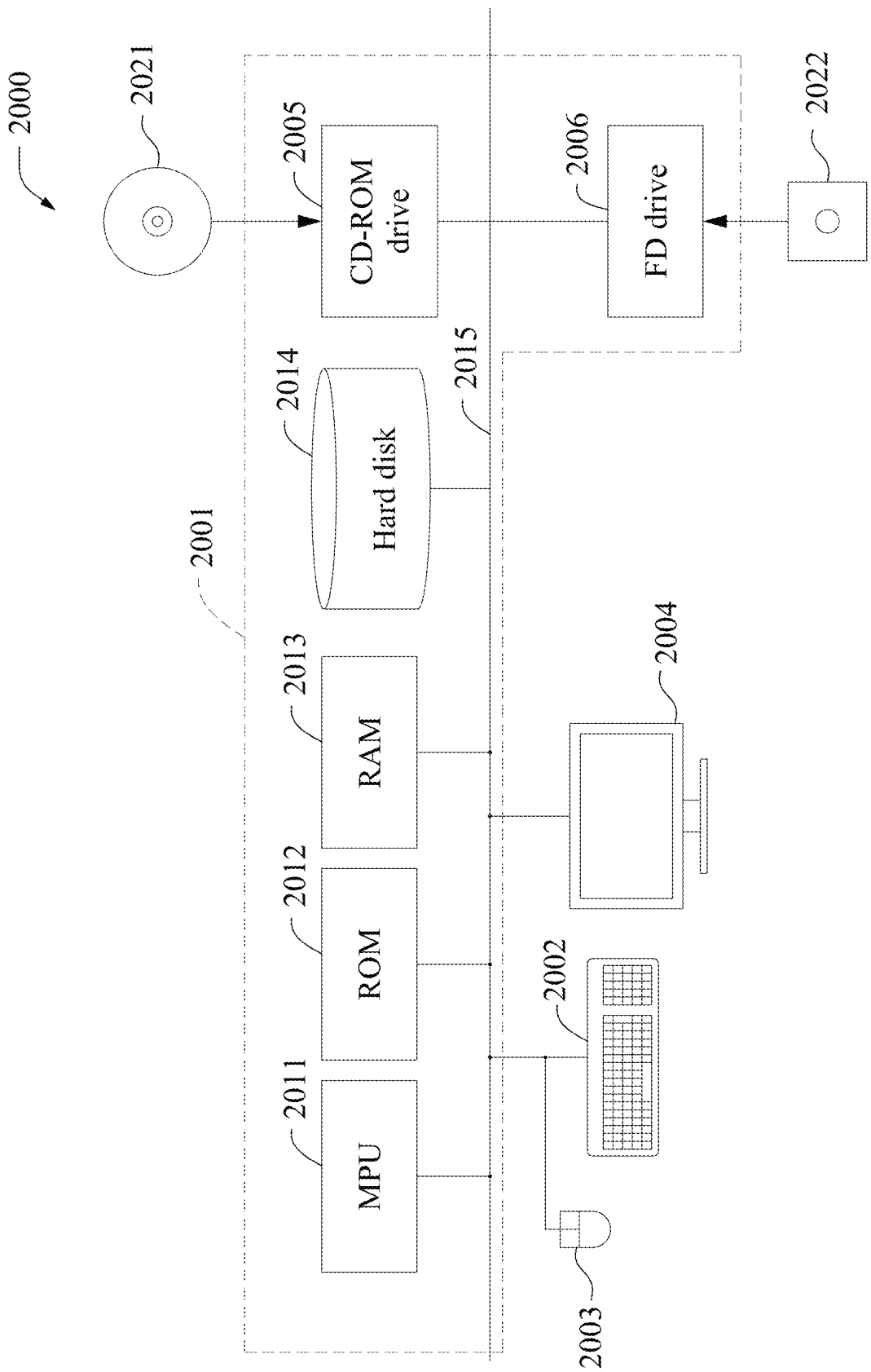

FIGS. 10A and 10B illustrate a configuration of the controller 1410 in accordance with some embodiments of the disclosure. In some embodiments, a computer system 2000 is used as the controller 1410. In some embodiments, the computer system 2000 performs the functions of the controller as set forth above.

FIG. 10A is a schematic view of a computer system. All of or a part of the processes, method and/or operations of the foregoing embodiments can be realized using computer hardware and computer programs executed thereon. In FIG. 10A, a computer system 2000 is provided with a computer 2001 including an optical disk read only memory (e.g., CD-ROM or DVD-ROM) drive 2005 and a magnetic disk drive 2006, a keyboard 2002, a mouse 2003, and a monitor 2004.

FIG. 10B is a diagram showing an internal configuration of the computer system 2000. In FIG. 10B, the computer 2001 is provided with, in addition to the optical disk drive 2005 and the magnetic disk drive 2006, one or more processors, such as a micro processing unit (MPU) 2011, a ROM 2012 in which a program such as a boot up program is stored, a random access memory (RAM) 2013 that is connected to the MPU 2011 and in which a command of an application program is temporarily stored and a temporary storage area is provided, a hard disk 2014 in which an application program, a system program, and data are stored, and a bus 2015 that connects the MPU 2011, the ROM 2012, and the like. Note that the computer 2001 may include a network card (not shown) for providing a connection to a LAN.

The program for causing the computer system 2000 to execute the functions of an apparatus for controlling the apparatus in the foregoing embodiments may be stored in an optical disk 2021 or a magnetic disk 2022, which are inserted into the optical disk drive 2005 or the magnetic disk drive 2006, and transmitted to the hard disk 2014. Alternatively, the program may be transmitted via a network (not shown) to the computer 2001 and stored in the hard disk 2014. At the time of execution, the program is loaded into the RAM 2013. The program may be loaded from the optical disk 2021 or the magnetic disk 2022, or directly from a network. The program does not necessarily have to include, for example, an operating system (OS) or a third party program to cause the computer 2001 to execute the functions of the controller 1410 in the foregoing embodiments. The program may only include a command portion to call an appropriate function (module) in a controlled mode and obtain desired results.

In some embodiments, the distance measurement using lasers is performed by using a laser interferometer technique. In other embodiments, the distance measurement is performed by using ultrasound, sonar, echo sounding, etc. In still other embodiments, the distance measurement is performed using Doppler devices that measure the distance using Doppler technique, magnetic sensors (magnetic encoders), rotary encoders, etc.

In some embodiments, the light source 1100 is disposed with a slit. In other embodiments, the light source 1100 is disposed with an adjustable slit. In a certain embodiment, the light source 1100 is disposed with an adjustable opening/aperture, for example, an iris diaphragm, which is actuated to increase the opening size, thereby allowing wider/narrower light to pass through the light source 1100 and resulting in an increase/decrease in a focal diameter of the light beam.

In some embodiments, a reflected light intensity of the reflected laser beam received by the light sensors 1210 of the array 1220 of light sensors is measured. The reflected intensity is measured between the intensity of the laser beam emitted from the laser beam transmitter 1110 and the intensity the beam is detected at the light sensors 1210 of the array 1220 after reflecting from the substrate 800, more specifically, from the top surface 802 of the substrate. In some embodiments, the reflected intensity by each of the light sensors 1210 within the array 1220 may be compared. If the reflected intensity of the light sensors 1210 are within a desired proximity of each other, it is determined that the applied liquid on the substrate is applied substantially uniformly. If the reflected intensity of the light sensors 1210 are not within the desired proximity, then it is determined that the applied liquid on the substrate is not applied substantially uniformly.

In various embodiments, a light monitoring system including a light source and a light detector is provided to monitor the status of a nozzle in real-time and liquid motion/dynamics on the wafer with the working principle of total internal reflection. Light monitoring systems according to embodiments of the disclosure provide improved identification of a leak from the nozzle or a liquid residue on the substrate, thereby improving the inspection operation and increasing the yield of the semiconductor manufacturing process.

It will be understood that not all advantages have been necessarily discussed herein, no particular advantage is required for all embodiments or examples, and other embodiments or examples may offer different advantages.

An embodiment of the disclosure is an apparatus for manufacturing a semiconductor device that includes a rotatable base configured to support a substrate and a nozzle arm. The nozzle arm includes a nozzle and a light monitoring device including a laser transmitter and an array of light sensors arranged in the nozzle arm and facing the rotatable base.

In some embodiments, the light monitoring device is configured to transmit a laser beam from the laser transmitter towards the substrate, wherein the laser beam impinges on the substrate. The light monitoring device is configured to receive a reflected laser beam from the substrate, and identify one or more light sensors of the array of light sensors that received the laser beam. The light monitoring device is configured to determine a process quality on the substrate by analyzing a signal of the array of light sensors reflected from the substrate.

In some embodiments, the laser transmitter is arranged on a lower surface of the nozzle arm facing the substrate. In some embodiments, the light monitoring device adjusts an angle of the laser transmitter towards the substrate to select the one or more light sensors that receive the reflected laser beam. In some embodiments, the apparatus further includes light sensors disposed at a location other than the nozzle or nozzle arm. In some embodiments, the apparatus further includes an analyzing device to send a notification when there is a leak from the nozzle on the substrate.

Another embodiment of the disclosure is a method for inspecting a semiconductor substrate. The method includes placing a substrate on a rotatable base. A nozzle arm is then positioning over the substrate, in which the nozzle arm includes one or more laser transmitters and an array of light sensors arranged in the nozzle arm and facing the substrate. Subsequently, a laser beam is transmitted using each of the one or more laser transmitters towards the substrate, and the laser beam impinges on the substrate. Then, a reflected laser beam is received from the substrate at the array of light sensors. One or more light sensors of the array of light sensors that received the laser beam are identified. By a light monitoring device, a signal of the array of light sensors reflected from the substrate is analyzed. Subsequently, it is determined whether a process quality on the substrate is within an acceptable range. When a process quality on the substrate is not within the acceptable range, a configurable parameter of a semiconductor manufacturing process is automatically adjusted to set the process quality within the acceptable range. In some embodiments, the configurable parameter includes one or more of: an incident angle of the laser transmitter towards the substrate, a number of light sensors of the array of light sensors that received the laser beam, a number of laser beam transmitters to emit, a moving speed at the center of the nozzle, a distance between the nozzle and the surface of the wafer, and a type of fluids, etc.

In some embodiments, it is determined whether there was a leak from the nozzle. In some embodiments, a second chemical liquid from the nozzle arm is dispensed when it is determined that there is no first chemical liquid on a surface of the substrate. In some embodiments, the light monitoring device is configured to determine whether there is a fluid ripple on the substrate. In some embodiments, the fluid dynamics of a fluid on the substrate is analyzed when it is determined there is a fluid ripple on the substrate. In some embodiments, it is determined there is a fluid ripple on the substrate by analyzing fluid dynamics of a fluid on the substrate. In some embodiments, the light monitoring devices transmit the laser beam at different times. In some embodiments, a reflected laser beam from a light sensor disposed at a location other than the nozzle or nozzle arm is received. In some embodiments, an angle of the laser transmitter towards the substrate is adjusted to select the one or more light sensors that receive the reflected laser beam.

According to another aspect of the present disclosure, a system for inspecting a semiconductor substrate. The system includes a substrate holder and a feedback controller coupled the substrate holder. The substrate holder includes a rotatable base configured to hold the substrate and a nozzle arm including a nozzle and a plurality of light monitoring devices arranged in the nozzle arm and facing the substrate. The light monitoring devices are configured to transmit a laser pulse towards the substrate, in which the laser pulse impinges on the substrate, and then receive a reflected laser pulse from the substrate. The light monitoring devices are configured to identify one or more light sensors of the plurality of the light monitoring devices that received the laser pulse. The light monitoring devices are configured to determine a process quality on the substrate by analyzing a signal of the plurality of light monitoring device from the substrate using a reflected light intensity.

In some embodiments, the light monitoring device is configured to record a fluid motion on the substrate using a camera. In some embodiments, the light monitoring device is configured to send a notification based on the process quality on the substrate when there is a leak from the nozzle on the substrate. In some embodiments, an analyzing device is programmed to send a notification based on the process quality on the substrate when there is a liquid residue on the substrate. In some embodiments, an analyzing device identifies a chemical based on the process quality on the substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for inspecting a semiconductor substrate, comprising:
   placing a substrate on a rotatable base;
   positioning a nozzle arm over the substrate, the nozzle arm including one or more laser transmitters and an array of light sensors arranged in the nozzle arm and facing the substrate;
   adjusting an angle of the one or more laser transmitters towards the substrate and transmitting a laser beam using each of the one or more laser transmitters towards the substrate, wherein the laser beam impinges on the substrate;
   receiving a reflected laser beam from the substrate at a subset of light sensors of the array of light sensors;
   identifying the subset of light sensors of the array of light sensors that received the laser beam;
   analyzing, by a light monitoring device, a signal of the subset of light sensors of the array of light sensors reflected from the substrate; and
   determining whether a process quality on the substrate is within an acceptable range; and
   when a process quality on the substrate is not within the acceptable range, automatically adjusting a configurable parameter of a semiconductor manufacturing process to set the process quality within the acceptable range.

2. The method of claim 1, further comprising:
   determining whether there was a leak from a nozzle on the nozzle arm.

3. The method of claim 2, further comprising:
   dispensing a second chemical liquid from the nozzle arm when it is determined that there is no first chemical liquid on a surface of the substrate.

4. The method of claim 3, wherein the light monitoring device is configured to determine whether there is a fluid ripple on the substrate.

5. The method of claim 4, further comprising:
   analyzing fluid dynamics of a fluid on the substrate when it is determined there is a fluid ripple on the substrate.

6. The method of claim 3, further comprising identifying a diameter of the second chemical liquid that is spread on the surface of the substrate.

7. The method of claim 1, further comprising:
   determining whether there is a liquid residue on the substrate by analyzing fluid dynamics of a fluid on the substrate.

8. The method of claim 1, wherein the light monitoring device transmits the laser beam at different times.

9. The method of claim 1, further comprising:
   receiving a reflected laser beam from a light sensor disposed at a location other than the nozzle arm.

10. A method for inspecting a semiconductor substrate, comprising:
    adjusting a nozzle arm over the semiconductor substrate, the nozzle arm including a plurality of light monitoring devices, one or more lasers, and a plurality of light sensors arranged in the nozzle arm and facing the semiconductor substrate;
    adjusting an angle of the one or more lasers towards the semiconductor substrate and generating a laser pulse towards the semiconductor substrate, wherein the laser pulse impinges on the semiconductor substrate;

capturing a reflected laser pulse from the semiconductor substrate at a subset of the plurality of light sensors;

detecting the subset of the plurality of light sensors that received the reflected laser pulse; and generating a process quality on the semiconductor substrate by the plurality of light monitoring devices analyzing a signal of the subset of the plurality of light sensors from an intensity of the reflected laser pulse from the semiconductor substrate.

11. The method of claim 10, wherein the plurality of light monitoring devices are configured to record a fluid motion on the semiconductor substrate using an image-capturing device.

12. The method of claim 10, wherein the plurality of light monitoring devices are configured to send a notification based on the process quality on the semiconductor substrate when there is a leak from a nozzle on the semiconductor substrate.

13. The method of claim 10, further comprising sending a notification based on the process quality on the semiconductor substrate when there is a liquid residue on the semiconductor substrate.

14. The method of claim 10, further comprising identifying a chemical based on the process quality on the semiconductor substrate.

15. An inspection method, comprising:

moving a nozzle over a substrate, the nozzle including at least one laser emitter and a light detector array directed towards the substrate, the light detector array including a plurality of light sensors;

adjusting an angle of the at least one laser emitter towards the substrate and emitting a laser beam by the at least one laser emitter towards the substrate;

detecting a reflected laser beam from the substrate by a subset of light sensors of the light detector array;

analyzing, by a spectrum analyzer, a signal of the subset of light sensors of the light detector array from the laser beam reflected from the substrate to determine whether a process quality on the substrate is within a threshold value, wherein the process quality indicates a presence or absence of fluid adjacent the nozzle or a purity of fluid adjacent the nozzle; and when a process quality on the substrate is not within the threshold value, adjusting a configurable parameter of a semiconductor manufacturing process to set the process quality within the threshold value.

16. The inspection method of claim 15, further comprising:

determining whether a leak exists from the nozzle.

17. The inspection method of claim 16, further comprising generating a notification based on the process quality on the substrate when the leak from the nozzle is determined.

18. The inspection method of claim 15, further comprising recording a motion of fluid on the substrate with an image-capturing device.

19. The inspection method of claim 15, further comprising identifying a chemical in the fluid by the spectrum analyzer.

20. The inspection method of claim 15, further comprising detecting the reflected laser beam from another light detector array disposed at a location other than the nozzle.

* * * * *